(12) United States Patent
Booth, Jr. et al.

(10) Patent No.: US 7,785,979 B2
(45) Date of Patent: Aug. 31, 2010

(54) INTEGRATED CIRCUITS COMPRISING RESISTORS HAVING DIFFERENT SHEET RESISTANCES AND METHODS OF FABRICATING THE SAME

(75) Inventors: Roger Allen Booth, Jr., Wappingers Falls, NY (US); Kangguo Cheng, Guilderland, NY (US); Terence B. Hook, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/173,407

(22) Filed: Jul. 15, 2008

(65) Prior Publication Data

US 2010/0013026 A1 Jan. 21, 2010

(51) Int. Cl.
  *H01L 21/324* (2006.01)
  *H01L 21/8238* (2006.01)
(52) U.S. Cl. ............... 438/385; 438/210; 257/E21.004
(58) Field of Classification Search ................. 438/210, 438/382, 384, 385; 257/E21.004; 29/610.1, 29/612
  See application file for complete search history.

(56) References Cited

U.S. PATENT DOCUMENTS

| | | | | |
|---|---|---|---|---|
| 4,214,917 | A | * | 7/1980 | Clark et al. ................ 438/385 |
| 4,408,385 | A | | 10/1983 | Mohan Rao et al. |
| 4,416,049 | A | * | 11/1983 | McElroy ..................... 438/238 |
| 4,592,128 | A | | 6/1986 | Bourassa |
| 4,604,789 | A | | 8/1986 | Bourassa |
| 4,641,173 | A | | 2/1987 | Malhi et al. |
| 4,643,777 | A | * | 2/1987 | Maeda ........................ 438/385 |
| 4,653,176 | A | * | 3/1987 | Van Ommen ................ 438/385 |
| 4,707,909 | A | * | 11/1987 | Blanchard ................... 438/385 |
| 4,849,344 | A | * | 7/1989 | Desbiens et al. ............ 438/331 |
| 4,916,507 | A | * | 4/1990 | Boudou et al. .............. 257/380 |
| 5,108,945 | A | | 4/1992 | Matthews |
| 5,141,597 | A | * | 8/1992 | Adams et al. ............... 438/384 |
| 5,185,285 | A | | 2/1993 | Hasaka |
| 5,236,857 | A | | 8/1993 | Eklund et al. |
| 5,384,278 | A | | 1/1995 | Singlevich |
| 5,397,729 | A | | 3/1995 | Kayanuma et al. |
| 5,438,014 | A | | 8/1995 | Hashimoto |
| 5,461,000 | A | | 10/1995 | Liang |
| 5,465,005 | A | | 11/1995 | Eklund et al. |

(Continued)

OTHER PUBLICATIONS

Nakabayashi, et al., "Influence of Hydrogen on Electrical Characteristics of Poly-Si Resistor", Japanese Journal of Applied Physics, C. 1982, pp. 3734-3738.

*Primary Examiner*—Mary Wilczewski
(74) *Attorney, Agent, or Firm*—Cantor Colburn LLP; Joseph Petrokaitis

(57) ABSTRACT

The fabrication of integrated circuits comprising resistors having the same structure but different sheet resistances is disclosed herein. In one embodiment, a method of fabricating an integrated circuit comprises: concurrently forming a first resistor laterally spaced from a second resistor above or within a semiconductor substrate, the first and second resistors comprising a doped semiconductive material; depositing a dopant receiving material across the first and second resistors and the semiconductor substrate; removing the dopant receiving material from upon the first resistor while retaining the dopant receiving material upon the second resistor; and annealing the first and second resistors to cause a first sheet resistance of the first resistor to be different from a second sheet resistance of the second resistor.

8 Claims, 14 Drawing Sheets

U.S. PATENT DOCUMENTS

| | | | |
|---|---|---|---|
| 5,489,547 A * | 2/1996 | Erdeljac et al. | 438/238 |
| 5,500,553 A | 3/1996 | Ikegami | |
| 5,530,418 A | 6/1996 | Hsu et al. | |
| 5,656,524 A | 8/1997 | Eklund et al. | |
| 5,728,615 A | 3/1998 | Cheng et al. | |
| 5,824,579 A | 10/1998 | Subramaniam et al. | |
| 5,834,815 A | 11/1998 | Cheng et al. | |
| 5,956,592 A * | 9/1999 | Ikegami | 438/384 |
| 5,976,944 A | 11/1999 | Czagas et al. | |
| 6,069,063 A | 5/2000 | Chang et al. | |
| 6,100,154 A | 8/2000 | Hsu et al. | |
| 6,211,030 B1 * | 4/2001 | Liou | 438/382 |
| 6,261,915 B1 * | 7/2001 | Eklund et al. | 438/384 |
| 6,507,087 B1 | 1/2003 | Yu | |
| 6,890,810 B2 * | 5/2005 | Amadon et al. | 438/210 |
| 6,908,777 B2 * | 6/2005 | Yamamoto | 438/18 |
| 7,079,412 B2 | 7/2006 | Chen et al. | |
| 7,202,533 B1 | 4/2007 | Beach et al. | |
| 7,277,319 B2 | 10/2007 | Perner et al. | |
| 2004/0241951 A1 * | 12/2004 | Amadon et al. | 438/382 |
| 2007/0272984 A1 * | 11/2007 | Tsukamoto et al. | 257/364 |

* cited by examiner

INTEGRATED CIRCUITS COMPRISING RESISTORS HAVING DIFFERENT SHEET RESISTANCES AND METHODS OF FABRICATING THE SAME

BACKGROUND OF THE INVENTION

1. Field of the Invention

This invention relates generally to semiconductor fabrication, and more particularly to fabricating integrated circuits comprising resistors having different sheet resistances.

2. Description of Background

Integrated circuit designers have been limited to one sheet resistance for the resistors integrated into a particular chip. Further, resistor sheet resistances currently vary significantly across different types of technology. The ability of designers to optimize design layout for increased density has been compromised by these limitations.

Design engineers would be able to better optimize integrated circuit designs if it were practical and economical to integrate resistors of various sheet resistances into a single integrated circuit structure. Design engineers have formed resistors of different materials in an integrated circuit such that the resistors have different sheet resistances. However, such techniques can be costly and time consuming because they utilize multiple deposition, lithography, and/or etch steps to form resistors from different materials.

SUMMARY OF THE INVENTION

The fabrication of integrated circuits comprising resistors having the same structure but different sheet resistances is disclosed herein. In one embodiment, a method of fabricating an integrated circuit comprises: concurrently forming a first resistor laterally spaced from a second resistor above or within a semiconductor substrate, the first and second resistors comprising a doped semiconductive material; depositing a dopant receiving material across the first and second resistors and the semiconductor substrate; removing the dopant receiving material from upon the first resistor while retaining the dopant receiving material upon the second resistor; and annealing the first and second resistors to cause a first sheet resistance of the first resistor to be different from a second sheet resistance of the second resistor.

In another embodiment, a method of fabricating an integrated circuit comprises: concurrently forming a first resistor laterally spaced from a second resistor above or within a semiconductor substrate, the first and second resistors comprising a doped semiconductive material; forming a first dopant receiving material upon the first resistor; forming a second dopant receiving material upon the second resistor, the second dopant receiving material being different in composition or form from the first dopant receiving material; and annealing the first and second resistors to cause a first sheet resistance of the first resistor to be different from a second sheet resistance of the second resistor.

In yet another embodiment, an integrated circuit comprises: a first resistor laterally spaced from a second resistor in the same level above or within a semiconductor substrate, wherein the first and second resistors comprise the same semiconductive material, and wherein the second resistor has a lower sheet resistance than the first resistor.

In an additional embodiment, a design structure embodied in a machine readable medium for designing, manufacturing, or testing a design comprises: a first resistor laterally spaced from a second resistor in the same level above or within a semiconductor substrate, wherein the first and second resistors comprise the same semiconductive material, and wherein the second resistor has a lower sheet resistance than the first resistor.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 1:
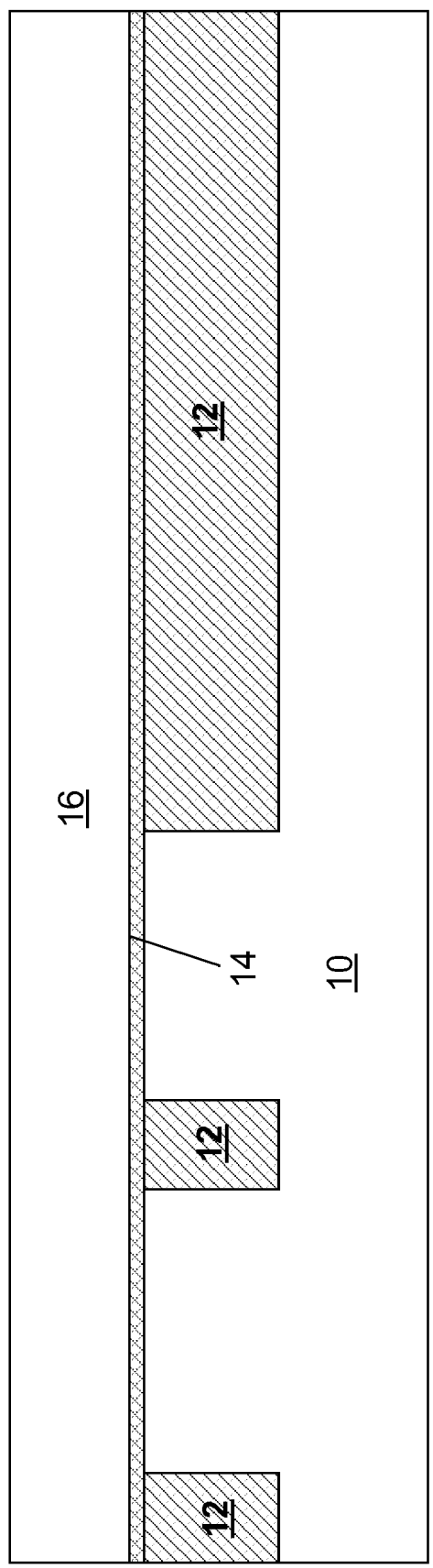
FIGS. 1-5 illustrate one example of a method for fabricating multiple resistors having the same structure and different sheet resistances.

Turning now to the drawings in greater detail, it will be seen that FIGS. 1-5 illustrate an exemplary embodiment of a method for fabricating multiple resistors and transistors having similar structures but different sheet resistances, respectively. As shown in FIG. 1, the fabrication of such devices first entails obtaining a bulk semiconductor substrate 10 comprising single crystalline silicon that has been slightly doped with n-type or p-type dopants. Alternatively, a semiconductor layer 10 can be formed upon an insulation layer (not shown) to create silicon-on-insulator (SOI) devices. Shallow trench isolation structures 12 can subsequently be formed in the semiconductor substrate 10 on opposite sides of the ensuing resistor and transistor device to isolate them from other active areas in the substrate 10. Next, a gate dielectric 14 can be formed across the semiconductor substrate 10. Examples of suitable materials for use in the gate dielectric 14 include but are not limited to thermally grown silicon dioxide ($SiO_2$), deposited $SiO_2$, or a high-k dielectric such as hafnium oxide ($HfO_2$) deposited by sputter deposition or atomic layer deposition. As used herein, the term "high-k dielectric" refers to dielectrics having a dielectric constant, k, greater than about 4.0, which is higher than the k value of $SiO_2$.

Figure 2:
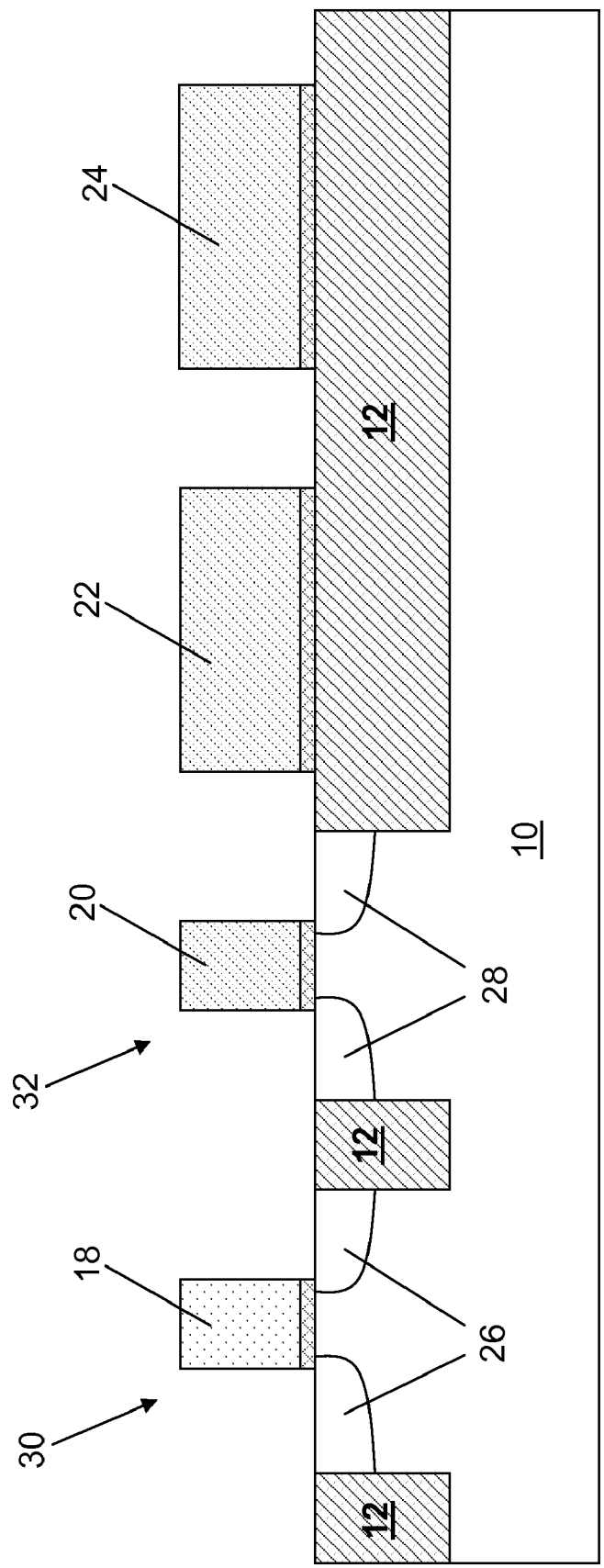

Turning to FIG. 2, a semiconductive material 16 comprising, e.g., polycrystalline silicon ("polysilicon") or amorphous silicon, can thereafter be deposited across the gate dielectric 14 and then patterned to define gate electrodes 18 and 20 and resistors 22 and 24, e.g., by using lithography and an anisotropic etch technique such as reactive ion etching (RIE). As shown, the gate dielectric 14 can be patterned along with the gate electrodes 18 and 20 and the resistors 22 and 24, or alternatively, the etch can be terminated before the gate dielectric 14 is removed from opposite sides of the gate electrodes 18 and 20 and resistors 22 and 24. Dielectric spacers can optionally be formed upon the sidewall surfaces of the gate electrodes 28 and 20 and the resistors 22 and 24 (not shown). Source and drain junctions 26 and 28 can then be formed in substrate 10 on the opposite sides of gate electrodes 18 and 20 through the implantation of n-type dopants into an NFET section of the substrate 50 and p-type dopants into a PFET section of the substrate 50 in two separate steps using masks. In this manner, an NFET 30 and a PFET 32 are formed that are laterally isolated from each other. Examples of n-type dopants include but are not limited to arsenic (As), phosphorus (P), and combinations comprising at least one of the foregoing dopants. Examples of p-type dopants include but are not limited to boron (B), boron difluoride ($BF_2$), indium (In), and combinations comprising at least one of the foregoing dopants. During these implantation steps, n-type dopants also become implanted into the gate electrode 18 corresponding to the NFET 30, and p-type dopants become implanted into the gate electrode 20 corresponding to the PFET 32. Each of the resistors 22 and 24 can be doped during at least one of these implantation steps, or they can be independently doped in a separate step. Preferably, the resistors 22 and 24 are doped with a p-type dopant using a boron-bearing gas such as pure B or $BF_2$.

Figure 3:
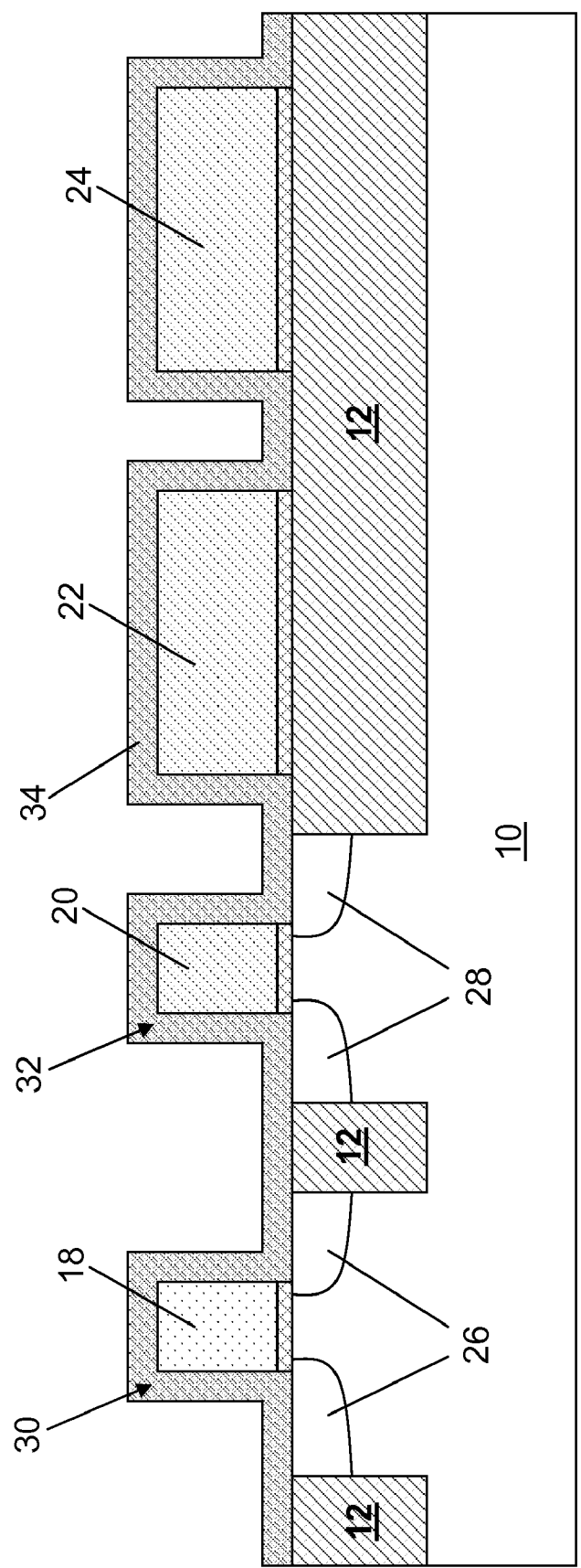

Next, as depicted in FIG. 3, a dopant receiving material 34 can be deposited across exposed surfaces of the NFET 30, the PFET 32, the substrate 10, and the resistors 22 and 24. As used herein "dopant receiving material" refers to a material capable of receiving dopants from an adjacent doped semiconductive material or a material capable of making dopants in an adjacent doped semiconductive material less conductive during a thermal anneal. The dopant receiving material can be deposited by any suitable deposition technique, including but not limited to, atomic layer deposition (ALD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), high temperature oxide deposition (HTO), low temperature oxide deposition (LTO), limited reaction processing CVD (LRPCVD), metalorganic chemical vapor deposition (MOCVD), molecular beam epitaxy (MBE), physical vapor deposition, sputtering, plating, evaporation, spin-on-coating, ion beam deposition, electron beam deposition, laser assisted deposition, and chemical solution deposition.

Examples of suitable dopant receiving materials include but are not limited to stressed silicon nitride, unstressed silicon nitride, stressed silicon dioxide, unstressed silicon dioxide, stressed silicon oxynitride, unstressed silicon oxynitride, a stressed high-k dielectric, an unstressed high-k dielectric, or a combination comprising at least one of the foregoing. The type of stress, namely tensile or compressive, and the stress level of such stressed materials can be established by controlling a number of different processing parameters, such as the temperature, gas energizer power level, and gas flows and flow ratios and pressure, and/or by treating the deposited nitride. For example, the amount of hydrogen in a stressed material can be altered through ultra-violet or electron beam exposure.

Optionally, a low temperature oxide (LTO) liner can be formed upon the semiconductor topography at relatively low temperature conditions before the deposition of the dopant receiving material 34 (not shown). For example, the LTO liner can be formed by CVD of $SiO_2$.

Figure 4:
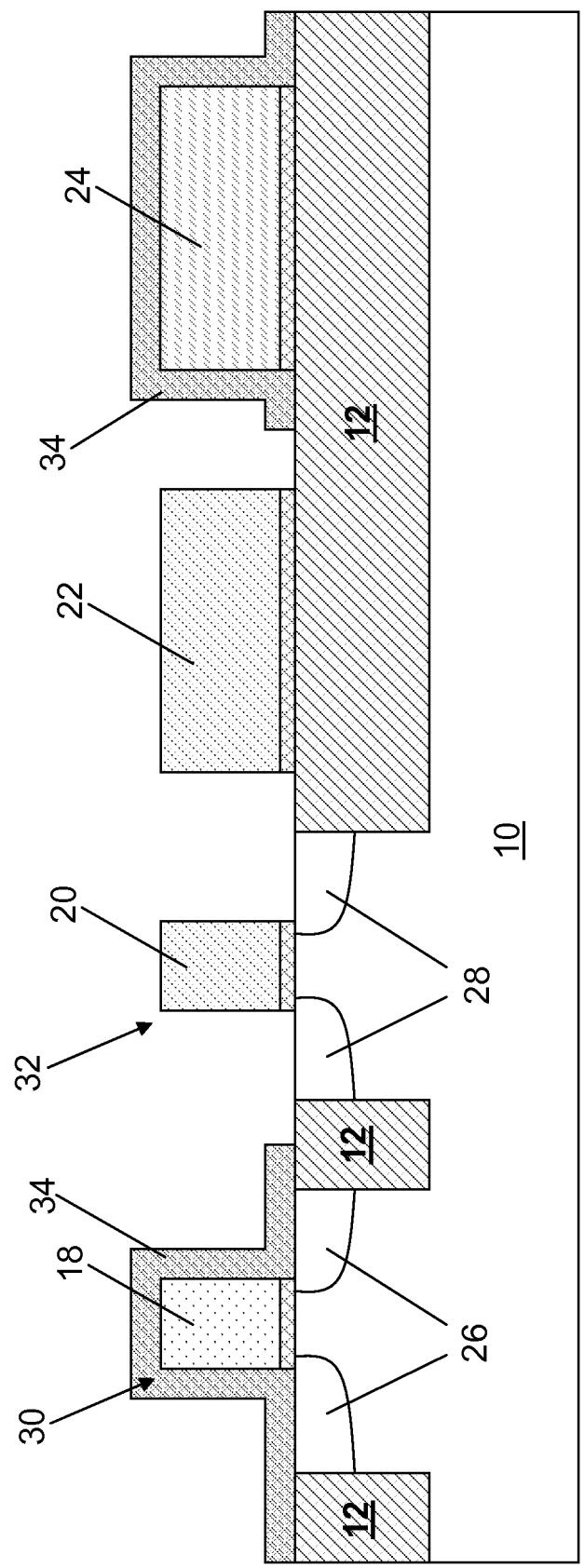
Figure 5:
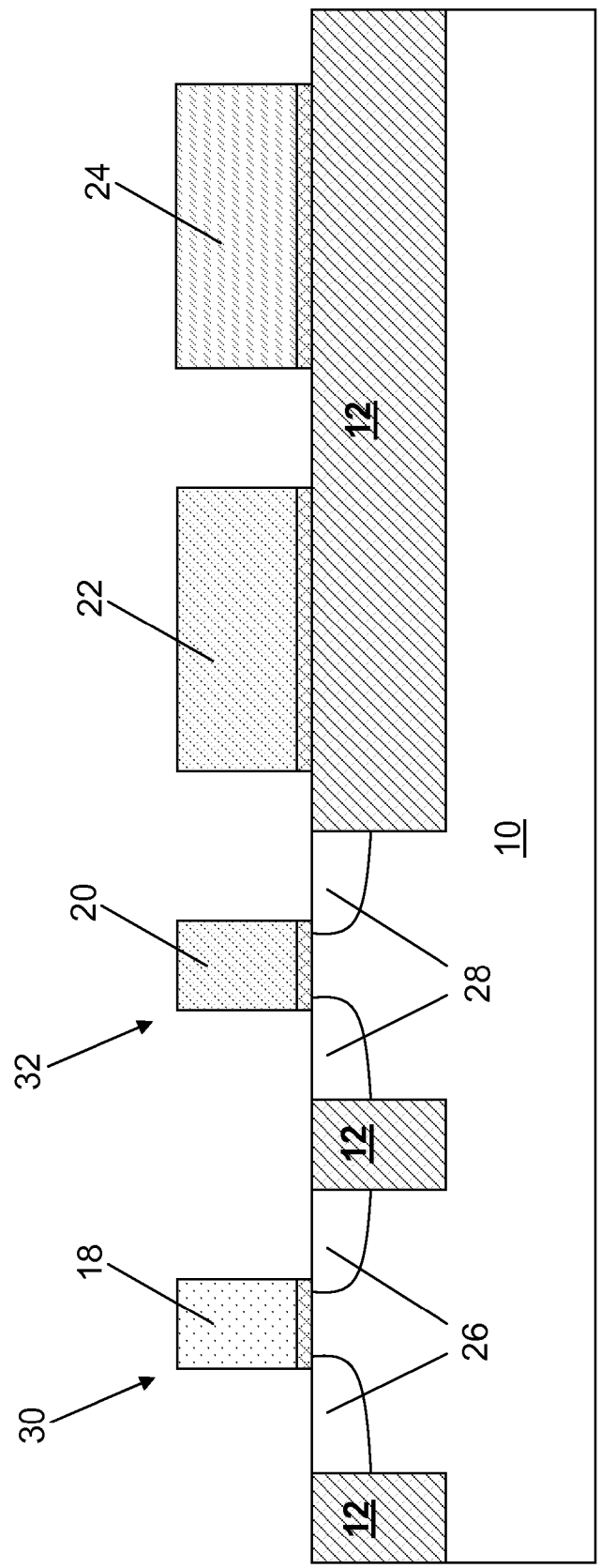

As shown in FIG. 4, select portions of the dopant receiving material 34 disposed upon the PFET 32 and the resistor 22 can subsequently be removed using lithography and an etch technique, e.g., RIE, while the dopant receiving material 34 is retained upon the NFET 30 and the resistor 34. It is understood that the dopant receiving material 34 could be removed from the NFET 30 instead of the PFET 32. It is also understood that the dopant receiving material 34 could be removed from the resistor 22 instead of the resistor 24. Next, the semiconductor topography shown in FIG. 4 can be subjected to an anneal technique such as rapid thermal processing (RTP), furnace anneal, and/or laser anneal. Depending upon the anneal technique, the anneal temperature can range from about 550° C. to about 1350° C., more specifically from about 700° C. to about 1150° C. The anneal duration can range from about 1 millisecond to about 3 minutes for RTP, from about 5 minutes to several hours for furnace anneal, and from about 1 nanosecond to about 1 second for laser anneal. During this anneal step, the concentration and/or distribution of active dopants in the resistor 24 can become different from the concentration and/or distribution of active dopants in the resistor 22 due to the presence of the dopant receiving material 34. For example, some dopants in the resistor 24 may migrate into the dopant receiving material 34 and/or some species such as hydrogen in the dopant receiving material 34 may diffuse into the resistor 24 and passivate some dopants therein, thus reducing the number of active dopants in the resistor 24. As a result, the sheet resistance of the resistor 24 increases such that it is higher than that of the resistor 22. Also, due to the stress effect of the dopant receiving material 34, tensile and/or compressive stress can be produced in the NFET 30 to improve its performance. After the annealing step, the retained dopant receiving material 34 can optionally be removed, e.g., using a selective etch technique, before forming subsequent levels of an integrated circuit, as shown in FIG. 5.

Figure 6:
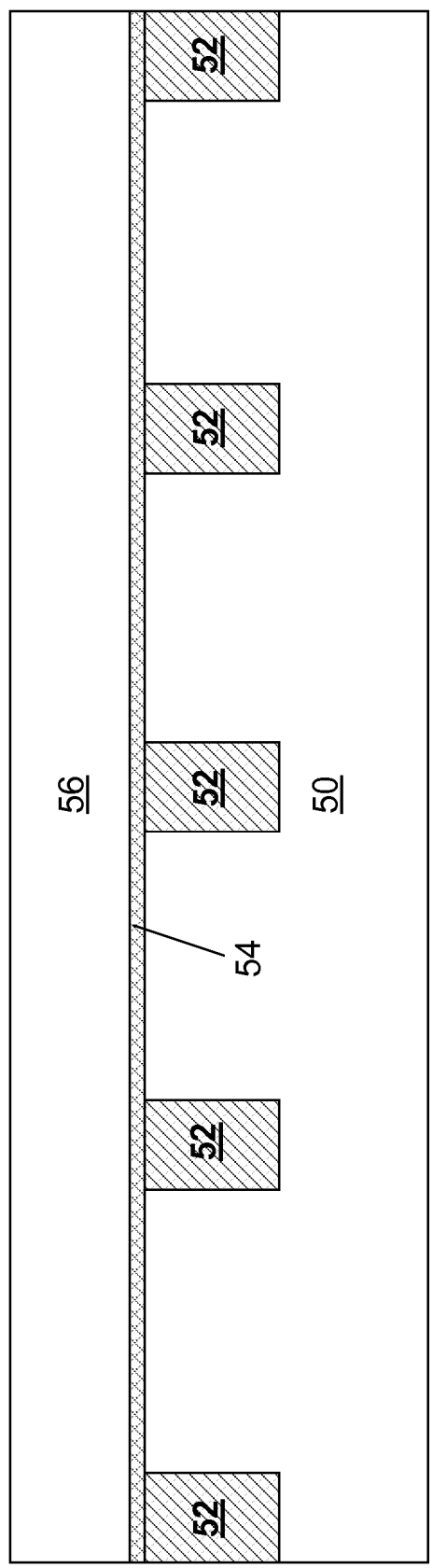
FIGS. 6-10 illustrate another example of a method for fabricating multiple resistors having the same structure and different sheet resistances.
Figure 7:
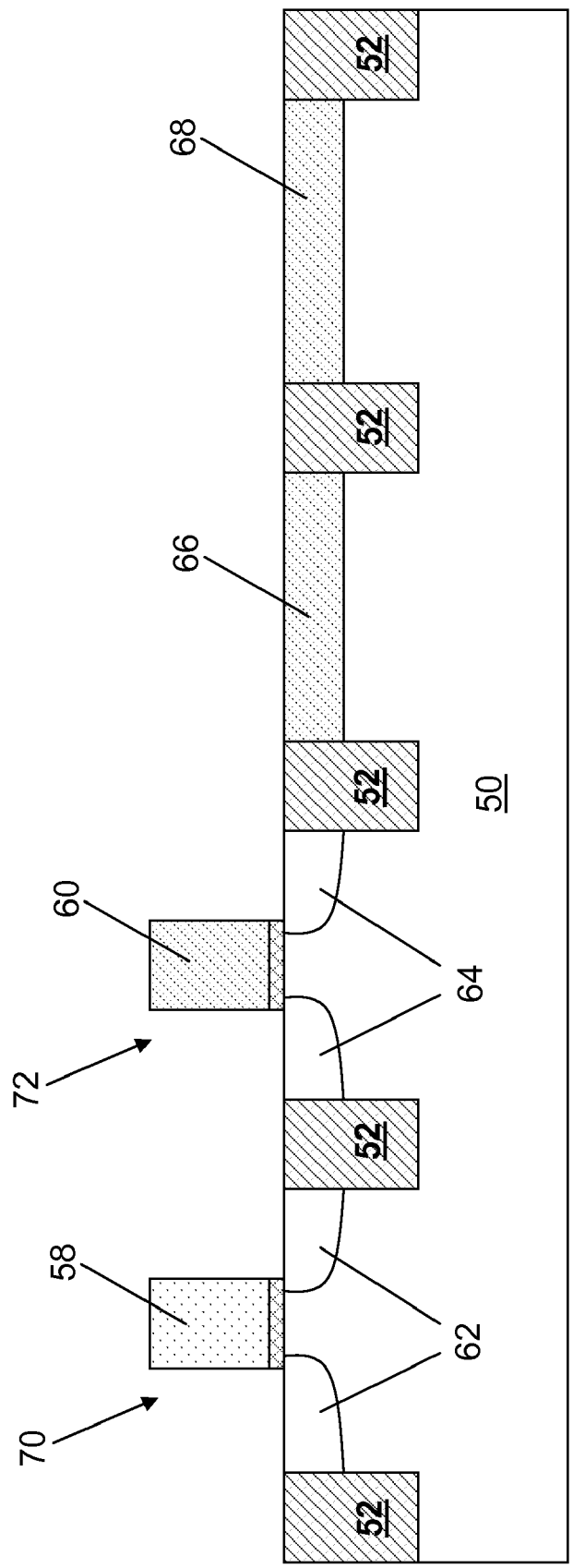

FIGS. 6-10 illustrate an alternative embodiment to the one shown in FIGS. 1-5, wherein multiple resistors having the same structure but different sheet resistances are formed within a semiconductor substrate 50. As shown in FIG. 6, this embodiment first involves forming shallow trench isolation regions 52 in the substrate 50 to isolate ensuing transistors and resistors in the same manner as in the previous embodiment. A gate dielectric 54 and a semiconductive material 56, e.g., polysilicon, can then be formed upon the substrate 50 and patterned to define gate electrodes 58 and 60 in the same manner as described previously. Optionally, dielectric spacers can be formed upon the sidewall surfaces of the gate electrodes 58 and 60 (not shown). Next, as depicted in FIG. 7, NFET source and drain junctions 62, PFET source and drain junctions 64, and resistors 66 and 68 can be formed through the implantation of the appropriate dopants into the appropriate sections of the substrate 50. Each of the resistors 66 and 68 can be implanted at the same time as at least one of the source and drain junctions 62 and 64 is implanted, or they can be independently doped in a separate step. Preferably, the resistors 66 and 68 are doped with a p-type dopant using a boron-bearing gas such as pure B or $BF_2$. Further, the gate electrodes 58 and 60 can be implanted at the same time as the source and drain junctions 62 and 64, respectively. An NFET 70, a PFET 72, and resistors 66 and 68 are formed as a result of these implantation steps.

Figure 8:
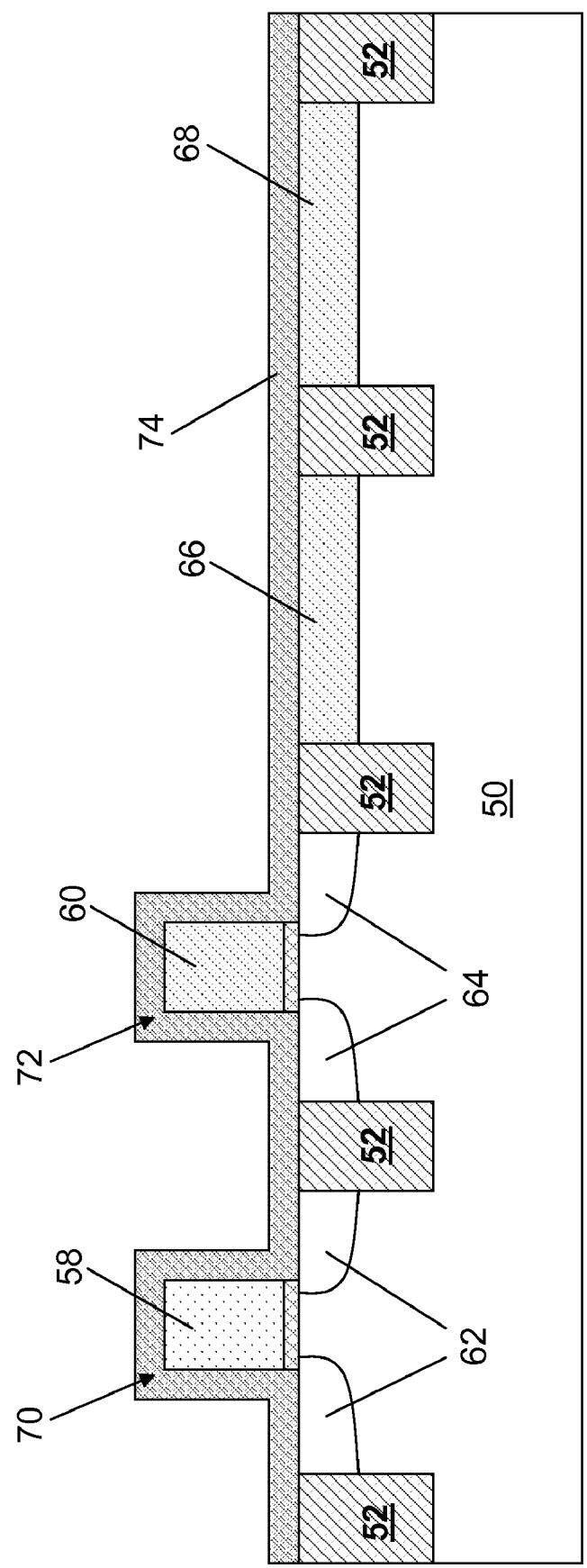
Figure 9:
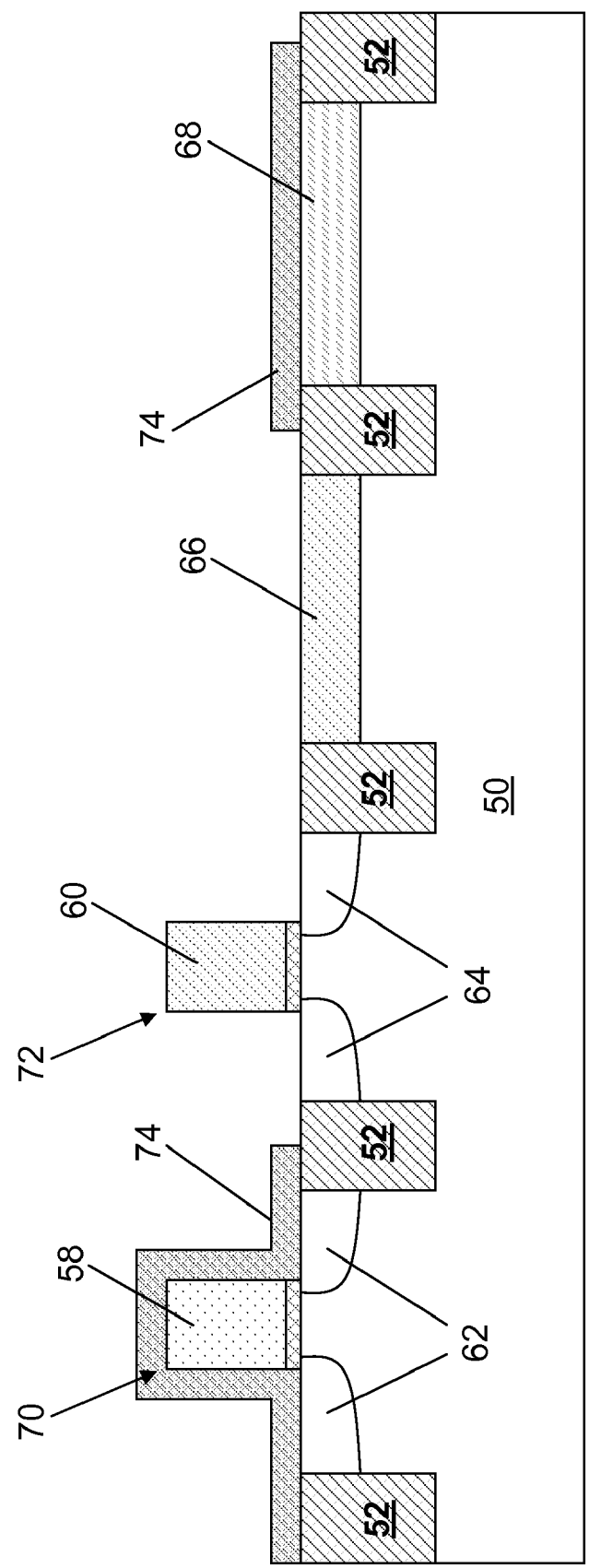
Figure 10:
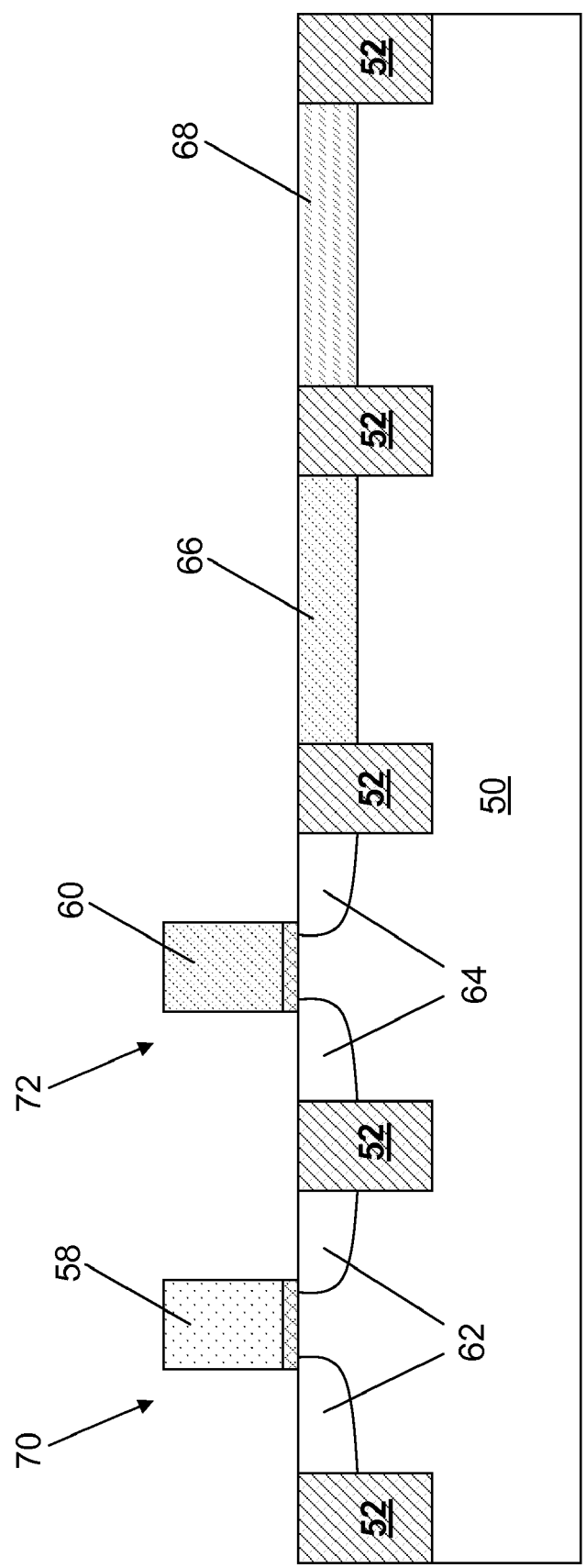

Turning to FIG. 8, a dopant receiving material 74 subsequently can be deposited across exposed surfaces of the NFET 70, the PFET 72, the resistors 66 and 68, and the substrate 50 in the same manner as described in the previous embodiment. Once again, an LTO layer optionally can be deposited before the dopant receiving material 74 is formed (not shown). As shown in FIG. 8, select portions of the dopant receiving material 74 can then be removed from upon the PFET 72 and the resistor 66 using lithography and an etch technique, e.g., RIE, while the dopant receiving material 74 is retained upon the NFET 70 and the resistor 68. It is understood that the dopant receiving material 74 could alternatively be retained upon the PFET 72 or the resistor 66. Subsequently, the semiconductor topography depicted in FIG. 8 can be annealed as described in the previous embodiment to cause some dopants to migrate from the resistor 68 and the NFET 70 into adjacent sections of the dopant receiving material 74 and/or to cause a species, e.g., hydrogen, to diffuse from the dopant receiving material 74 to the resistor 68 and the NFET 70 and thus passivate some dopants therein. As a result, the sheet resistance of the resistor 68 increases such that it is higher than that of the resistor 66. Also, due to the stress effect of the dopant receiving material 74, tensile and/or compressive stress can be produced in the NFET 70 to improve its performance. Optionally, as depicted in FIG. 9, the remaining dopant receiving material 74 can be removed after the anneal step, or it can be left in place as part of the ensuing integrated circuit.

Figure 11:
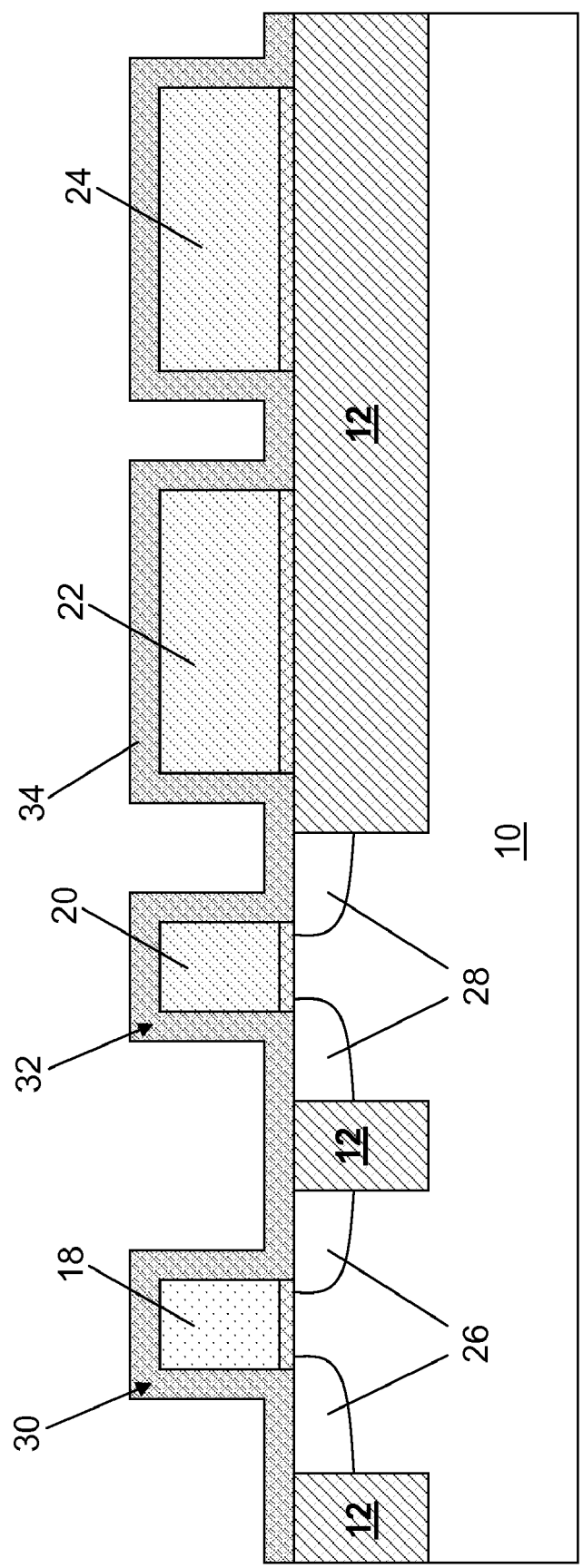
FIGS. 11-14 illustrate another example of a method for fabricating multiple resistors having the same structure and different sheet resistances.
Figure 12:
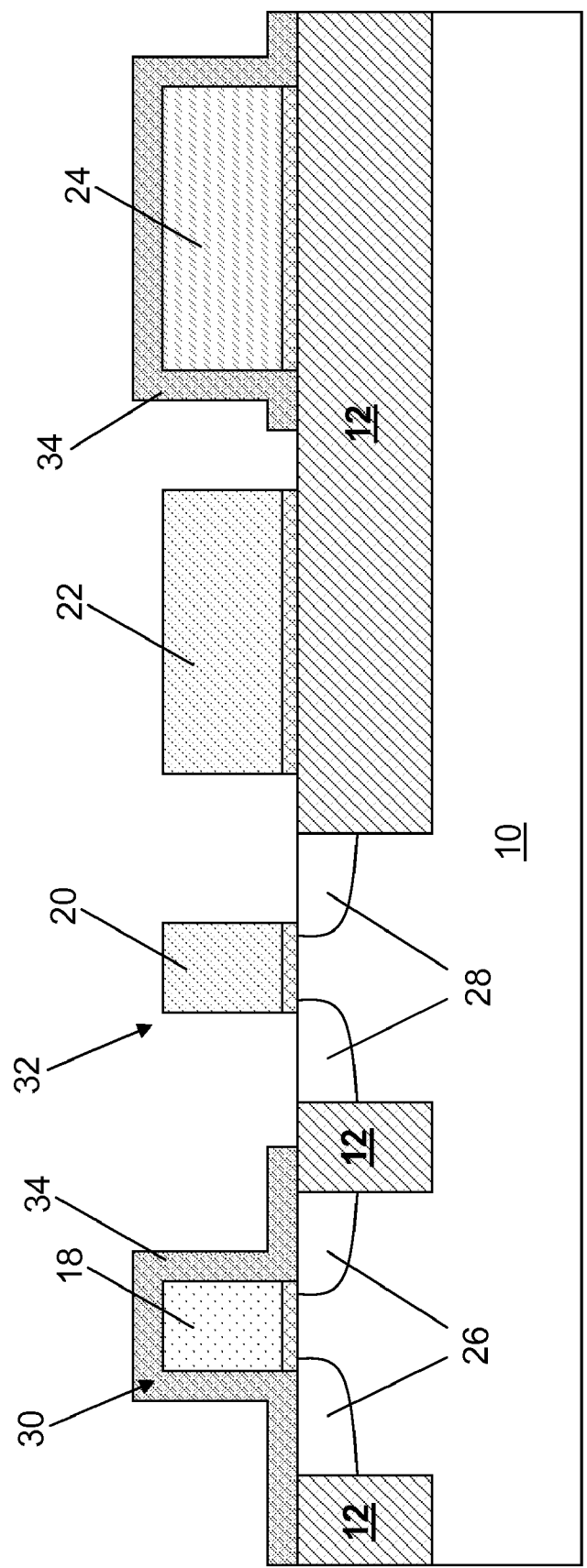
Figure 13:
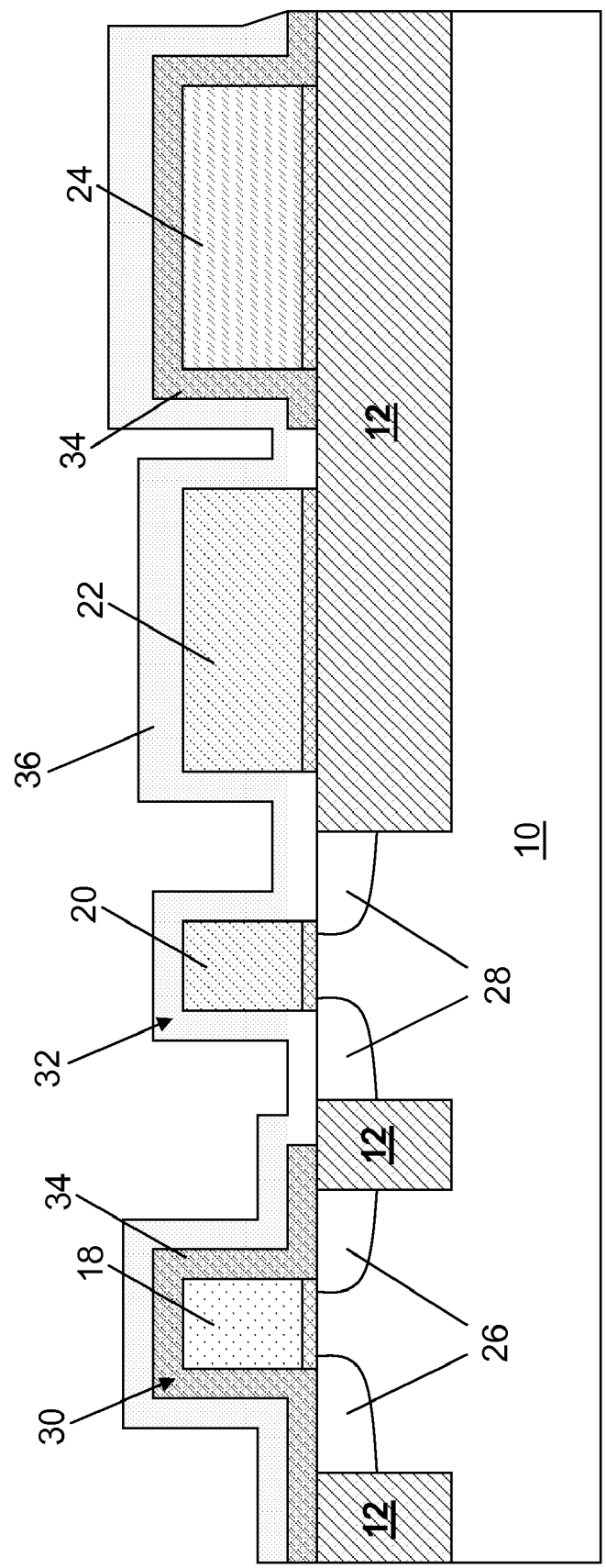

FIGS. 11-14 illustrate yet another exemplary embodiment of a method for forming multiple resistors having the same structure but different sheet resistances. In particular, FIG. 11 is the same as FIG. 3 of the first embodiment and depicts a dopant receiving material 34 disposed upon an NFET 30, a PFET 32, a first resistor 22, and a second resistor 24, all of which are formed in the same manner as described with reference to FIGS. 1-3. Next, as shown in FIG. 12, select portions of the dopant receiving material 34 can be removed from upon PFET 32 and resistor 22 while retaining the dopant receiving material 34 upon NFET 30 and resistor 24 in the same manner as described with reference to FIG. 4. However, the next step is different from the first embodiment in that it entails depositing a second dopant receiving material 36 across exposed surfaces of the first dopant receiving material 34, the PFET 32, and the resistor 22. The second dopant receiving material 36 is desirably different in composition or form from the first dopant receiving material 36. For example, one can comprise tensile stressed nitride while the other comprises compressive stressed nitride. "Compressive stressed nitride" refers to stressed silicon nitride having an absolute value of compressive stress of greater than about 0.1 GigaPascals (GPa), more specifically about 1 GPa to about 3.5 GPa. "Tensile stressed nitride" refers to stressed silicon nitride having a tensile stress of greater than about 0.1 GPa, more specifically about 1 GPa to about 3.5 GPa. Examples of suitable dopant receiving materials for use in layers 34 and 36 include but are not limited to stressed silicon nitride, unstressed silicon nitride, stressed silicon dioxide, unstressed silicon dioxide, stressed silicon oxynitride, unstressed silicon oxynitride, a stressed high-k dielectric, an unstressed high-k dielectric, or a combination comprising at least one of the foregoing. The type of stress, namely tensile or compressive, and the stress level of such stressed materials can be established by controlling a number of different processing parameters, such as the temperature, gas energizer power level, and gas flows and flow ratios and pressure, and/or by treating the deposited nitride. For example, the amount of hydrogen in a stressed material can be altered through ultra-violet or electron beam exposure.

Figure 14:
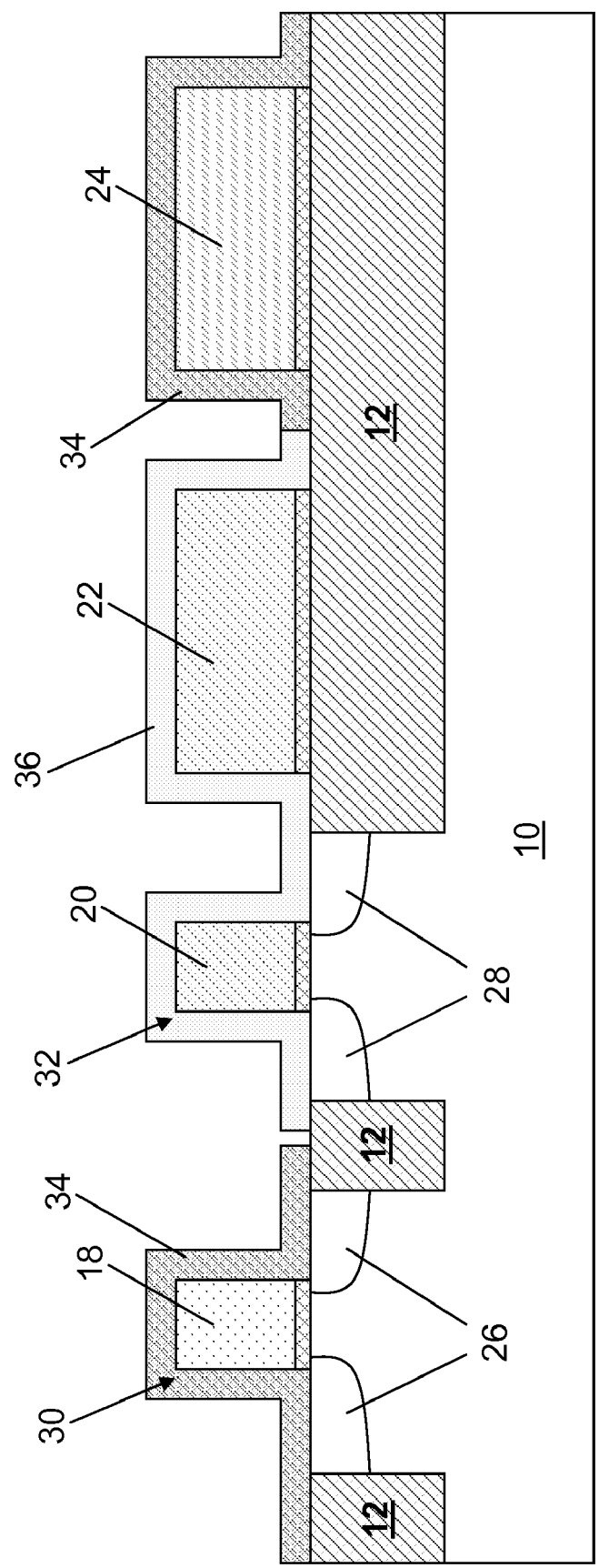

Subsequently, as shown in FIG. 14, the second dopant receiving material 36 can be removed from all areas except from upon PFET 32 and resistor 22 using lithography and an etch technique, e.g., RIE. Thus, the first dopant receiving material 34 is retained upon the NFET 30 and the resistor 24, whereas the second dopant receiving material is retained upon the PFET 32 and the resistor 22. It is understood that in all of the foregoing embodiments, the PFET and the NFET could be reversed. The semiconductor topography depicted in FIG. 14 can then be annealed by RTP, furnace anneal, or laser anneal. Depending upon the anneal technique, the anneal temperature can range from about 550° C. to about 1350° C., more specifically from about 700° C. to about 1150° C. The anneal duration can range from about 1 millisecond to about 3 minutes for RTP, from about 5 minutes to several hours for furnace anneal, and from about 1 nanosecond to about 1 second for laser anneal. This anneal can cause the dopants in the NFET 30 and the resistor 24 to migrate to adjacent sections of the first dopant receiving material 34 and/or some species such as hydrogen in the dopant receiving material 34 to diffuse to the NFET 30 and the resistor 24. This anneal can further cause the dopants in the PFET 32 and the resistor 22 to migrate to adjacent sections of the second dopant receiving material 36 and/or some species such as hydrogen in the dopant receiving material 36 to diffuse to the PFET 32 and the resistor 22. As a result, the sheet resistances of resistors 22 and 24 become different and the dopant concentrations and/or distributions in the NFET 30 and the PFET 32 become different. Also, the stress effects of the dopant receiving materials 34 and 36 can produce tensile and/or compressive stress in the NFET 30 and the PFET 32, thereby improving device performance. As in previous embodiments, the dopant receiving materials 34 and 36 can be removed or left in place in the ensuing integrated circuit. This method of using two different dopant receiving materials 34 and 36 could also be applied to the case where the resistors 22 and 24 are formed in the semiconductor substrate 10 rather than above the substrate 10.

The foregoing embodiments strategically form resistors of different sheet resistances within the same integrated circuit chip without the need to pattern multiple layers of resistors comprising different materials. Moreover, the presence of resistors having different sheet resistances within the same chip allows the design engineer to select the best attributes of both types of resistors as needed within the circuit design. The design engineer thus does not have to compromise circuit performance as a result of having only one available resistor type. The design engineer can therefore optimize design layout to achieve increased integration density of the various structures in the chip.

As used herein, the terms "a" and "an" do not denote a limitation of quantity but rather denote the presence of at least one of the referenced items. "Optional" or "optionally" means that the subsequently described event or circumstance may or may not occur, and that the description includes instances where the event occurs and instances where it does not. Moreover, ranges directed to the same component or property are inclusive of the endpoints given for those ranges (e.g., "about 5 wt % to about 20 wt %," is inclusive of the endpoints and all intermediate values of the range of about 5 wt % to about 20 wt %). Reference throughout the specification to "one embodiment", "another embodiment", "an embodiment", and so forth means that a particular element (e.g., feature, structure, and/or characteristic) described in connection with the embodiment is included in at least one embodiment described herein, and might or might not be present in other embodiments. In addition, it is to be understood that the described elements may be combined in any suitable manner in the various embodiments. Unless defined otherwise, technical and scientific terms used herein have the same meaning as is commonly understood by one of skill in the art to which this invention belongs.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method of fabricating an integrated circuit, comprising:
concurrently forming a first resistor laterally spaced from a second resistor above or within a semiconductor substrate, the first and second resistors comprising a doped semiconductive material;
depositing a dopant receiving material across the first and second resistors and the semiconductor substrate;
removing the dopant receiving material from upon the first resistor while retaining the dopant receiving material upon the second resistor; and
annealing the first and second resistors so as to cause one or more of:
diffusing dopant material from the second resistor into the dopant receiving material, and diffusing a species from the dopant receiving material to the second resistor to passivate some of the dopant material in the second resistor, thereby increasing a first sheet resistance of the first resistor with respect to a second sheet resistance of the second resistor.

2. The method of claim 1, wherein the dopant receiving material comprises stressed silicon nitride, unstressed silicon nitride, stressed silicon dioxide, unstressed silicon dioxide, stressed silicon oxynitride, unstressed silicon oxynitride, a stressed high-k dielectric, an unstressed high-k dielectric, or a combination comprising at least one of the foregoing.

3. The method of claim 1, wherein a first transistor laterally isolated from a second transistor is also disposed upon and within the semiconductor substrate, and wherein at least one of the first and second transistors is doped at the same time as at least one of the first and second resistors is doped such that one of the first and second transistors is a PFET and another of the first and second transistors is an NFET.

4. The method of claim 3, wherein the dopant receiving material is also deposited across the first and second transistors concurrent with depositing the dopant receiving material across the first and second resistors, wherein the dopant receiving material is removed from upon one of the first and second transistors concurrent with removing the dopant receiving material from upon the first resistor, and wherein said annealing causes additional dopants to migrate from another of the first and second transistors coated to the adjacent dopant receiving material.

5. A method of fabricating an integrated circuit, comprising:
concurrently forming a first resistor laterally spaced from a second resistor above or within a semiconductor substrate, the first and second resistors comprising a doped semiconductive material;
forming a first dopant receiving material upon the first resistor, the first dopant receiving material comprising tensile stressed nitride;
forming a second dopant receiving material upon the second resistor, the second dopant receiving material comprising compressive stressed nitride; and
annealing the first and second resistors to cause a first sheet resistance of the first resistor to be different from a second sheet resistance of the second resistor.

6. The method of claim 5, wherein a first transistor laterally isolated from a second transistor is also disposed upon and within the semiconductor substrate, and wherein at least one of the first and second transistors is doped at the same time as at least one of the first and second resistors is doped such that one of the first and second transistors is a PFET and another of the first and second transistors is an NFET.

7. The method of claim 6, wherein the first dopant receiving material is also formed upon one of the first and second transistors concurrent with forming the first dopant receiving material upon the first resistor, and wherein the second dopant receiving material is also formed upon another of the first and second transistors concurrent with forming the second dopant receiving material upon the second resistor.

8. The method of claim 7, wherein said annealing causes additional dopants to migrate from the first and second transistors to the adjacent dopant receiving material.

* * * * *